United States Patent [19]

Miyamoto et al.

[11] Patent Number: 5,752,119
[45] Date of Patent: May 12, 1998

[54] ARRANGEMENT OF STRUCTURE IN A CAMERA FOR REDUCED THICKNESS

[75] Inventors: Hidenori Miyamoto, Urayasu; Isao Soshi, Tokyo, both of Japan

[73] Assignee: Nikon Corporation, Tokyo, Japan

[21] Appl. No.: 478,929

[22] Filed: Jun. 7, 1995

Related U.S. Application Data

[63] Continuation of Ser. No. 412,208, Mar. 27, 1995, abandoned, which is a continuation of Ser. No. 187,312, Jan. 27, 1994, abandoned.

[30] Foreign Application Priority Data

Jan. 28, 1993 [JP] Japan .................................. 5-012797

[51] Int. Cl.⁶ .................................................. G03B 7/00
[52] U.S. Cl. ........................................ 396/535; 396/542
[58] Field of Search .................................. 354/145.1, 288, 354/485; 396/301, 439, 535, 539, 542

[56] References Cited

U.S. PATENT DOCUMENTS

| | | | |
|---|---|---|---|
| 4,926,207 | 5/1990 | Eguchi et al. | 396/301 |
| 5,001,505 | 3/1991 | Tosaka et al. | 396/535 X |
| 5,150,140 | 9/1992 | Kitazawa | 396/353 X |

FOREIGN PATENT DOCUMENTS 5-158114  6/1993  Japan .

*Primary Examiner*—Safet Metjahic
*Assistant Examiner*—J. K. Han
*Attorney, Agent, or Firm*—Oliff & Berridge

[57] ABSTRACT

A camera according to the present invention is provided wherein a pair of electric energy storage devices spaced from each other in the direction of the thickness of the camera so as to extend in the direction perpendicular to the film winding direction, and a circuit board having a plurality of electric parts mounted thereon is disposed along the pair of electric energy storage devices so that the electric parts are located between the pair of electric energy storage devices.

11 Claims, 5 Drawing Sheets

ARRANGEMENT OF STRUCTURE IN A CAMERA FOR REDUCED THICKNESS

This is a Continuation of application Ser. No. 08/412,208 filed Mar. 27, 1995, now abandoned, which in turn is a Continuation of application Ser. No. 08/187,312, filed Jan. 27, 1994, now abandoned.

BACKGROUND OF THE INVENTION

1. Field of The Invention

The present invention relates to a camera with improved arrangements for electric energy storage devices such as flash-activating main capacitors or batteries and electric parts thereof.

2. Related Background Art

Conventionally, lens-shutter cameras having a compact-sized body used one cylindrical capacitor as a main capacitor for storing flash-activating charge, disposed along the internal circumferential surface at one end of the camera body in the direction of the height is of the camera.

The diameter of the capacitor is inevitably determined by the electrical capacity required for flashlight photographing and the limits on the camera height. A camera with reduced camera height requires a greater diameter capacitor. The diameter of the capacitor would not affect the camera thickness to cause a problem due to the diameter being small enough to be contained within the camera thickness. On the other hand, the camera width (lateral length) depends on the diameter of the capacitor. Therefore, the diameter of the capacitors is desirable to be as small as possible for the purpose of making the camera compact-sized. To solve the problem, an attempt is known to make a camera compact-sized by using a capacitor having a rectangular section with a shorter dimension in the direction of the camera width and a longer dimension in the direction of the camera thickness. This attempt, however, results in an increased cost due to the uniqueness of such an irregular-shaped capacitor.

Thus, the applicant of the present invention previously proposed a camera employing two capacitors having a smaller diameter (accordingly a smaller capacity) than the ordinary capacitor, wherein the capacitors are disposed in parallel in the direction of the camera thickness along the internal circumferential surface at one end of the camera body (Japanese laid-open patent application No.5-158114). According to such a camera, the lateral dimension (width) of the camera can be shortened without decreasing the capacity required for flashing.

The above-mentioned reference, however, only discloses the arrangement for the main capacitors but does not refer to the arrangement for flash-activating electric parts for flash lighting, such as a voltage step-up transformer and a trigger capacitor. An inappropriate arrangement for such electric parts could result in a camera being hindered from getting compact-sized.

SUMMARY OF THE INVENTION

An object of embodiments of the present invention is to provide a camera using a pair of electric energy storage devices with a compact size by efficiently arranging the electric parts.

To achieve the above object and other objects, a camera according to embodiments of the present invention comprises a pair of electric energy storage devices located within the camera body and being spaced from each other in the direction of the thickness of the camera so as to extend in the direction perpendicular to the film winding direction. A circuit board is positioned between the pair of electric energy storage devices. A plurality of electric parts mounted on the circuit board so as to be disposed between the pair of electric energy storage devices.

With this arrangement, the space between the pair of electric energy storage devices can be efficiently utilized, resulting in a compact-sized camera.

The camera according to one embodiment of the present invention has a circuit board with a first part disposed along the longitudinal direction of the pair of electric energy storage devices and a second part integrally formed therewith located above the pair of electric energy storage devices. A photographing control circuit board is positioned within the camera body so as to extend from the vicinity of the upper end of the second part in the direction substantially perpendicular to the circuit board. Small-sized electric parts are mounted on the first part of the circuit board. The small-sized electric parts are located between the pair of electric energy storage devices. Large-sized electric parts are mounted on the second part of the circuit board. The large-sized electric parts are located between the photographing control circuit board and the upper end face of the pair of electric energy storage devices.

With this arrangement, to the space between the pair of electric energy storage devices and the space above the electric energy storage devices can be efficiently utilized. Furthermore, the large-sized electric parts can be efficiently arranged without interfering with the photographing control circuit board.

The camera according to another embodiment of the present invention comprises two electric energy storage devices located within the camera body, each having a different length spaced from each other in the direction of the thickness of said camera so as to extend in the direction perpendicular to the film winding direction. An electric part is positioned in the space above and/or below one of said electric energy storage devices and on the side of the other of said electric energy storage devices.

With this particular arrangement, the space above one of the two electric energy storage devices can be used efficiently utilized, thus contributing to promotion of compact-sizedness in a camera.

BRIEF DESCRIPTION OF THE DRAWINGS

The invention will be described in conjunction with the following drawings in which the reference numerals designate like elements and wherewith.

DETAILED DESCRIPTION OF THE PREFERRED EMBODIMENTS

Referring to FIGS. 1–4, an embodiment of the present invention will be described.

Figure 1:
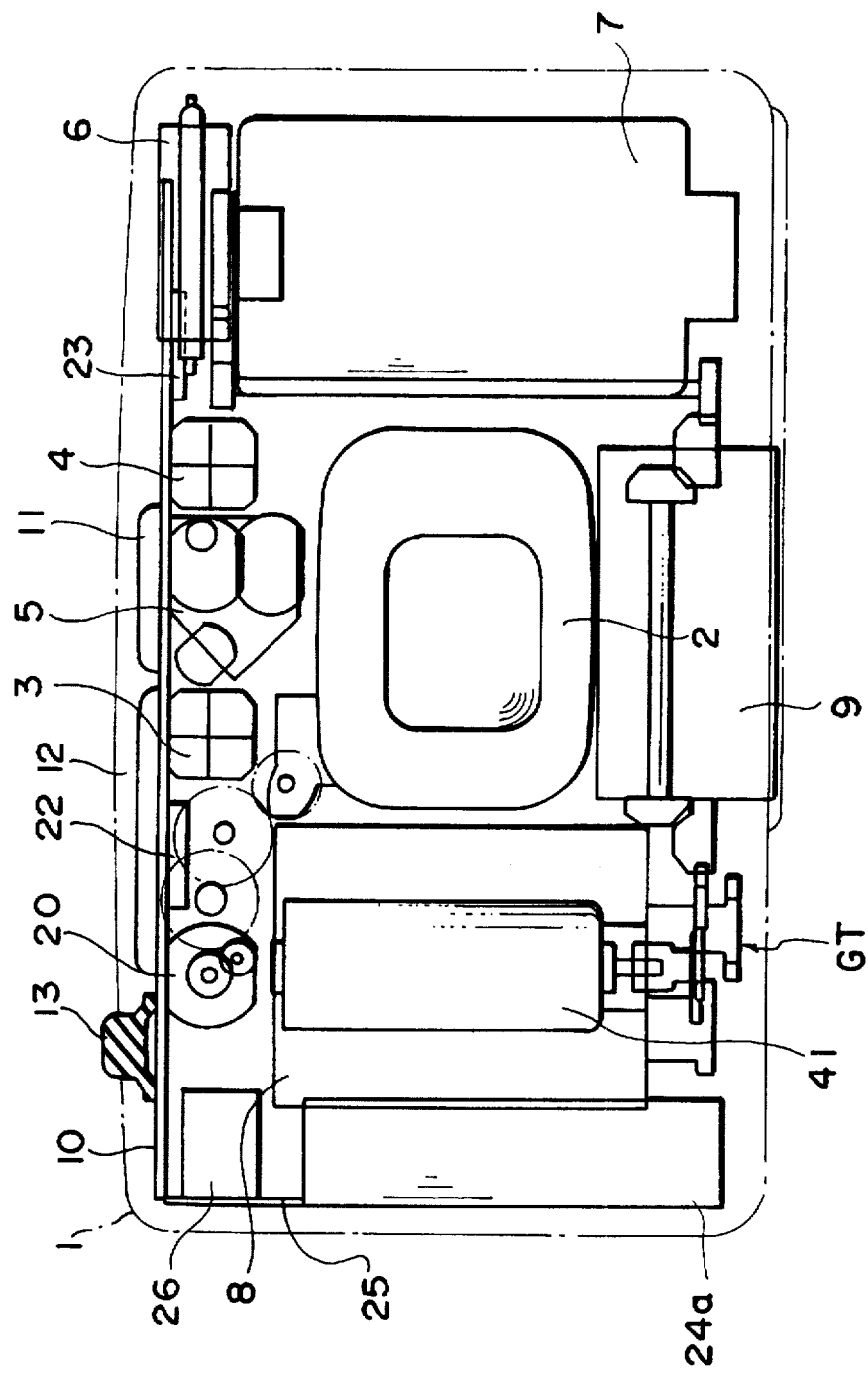
FIG. 1 is a front view of a camera according to an embodiment of the present invention, showing the internal construction of the camera.
Figure 2:
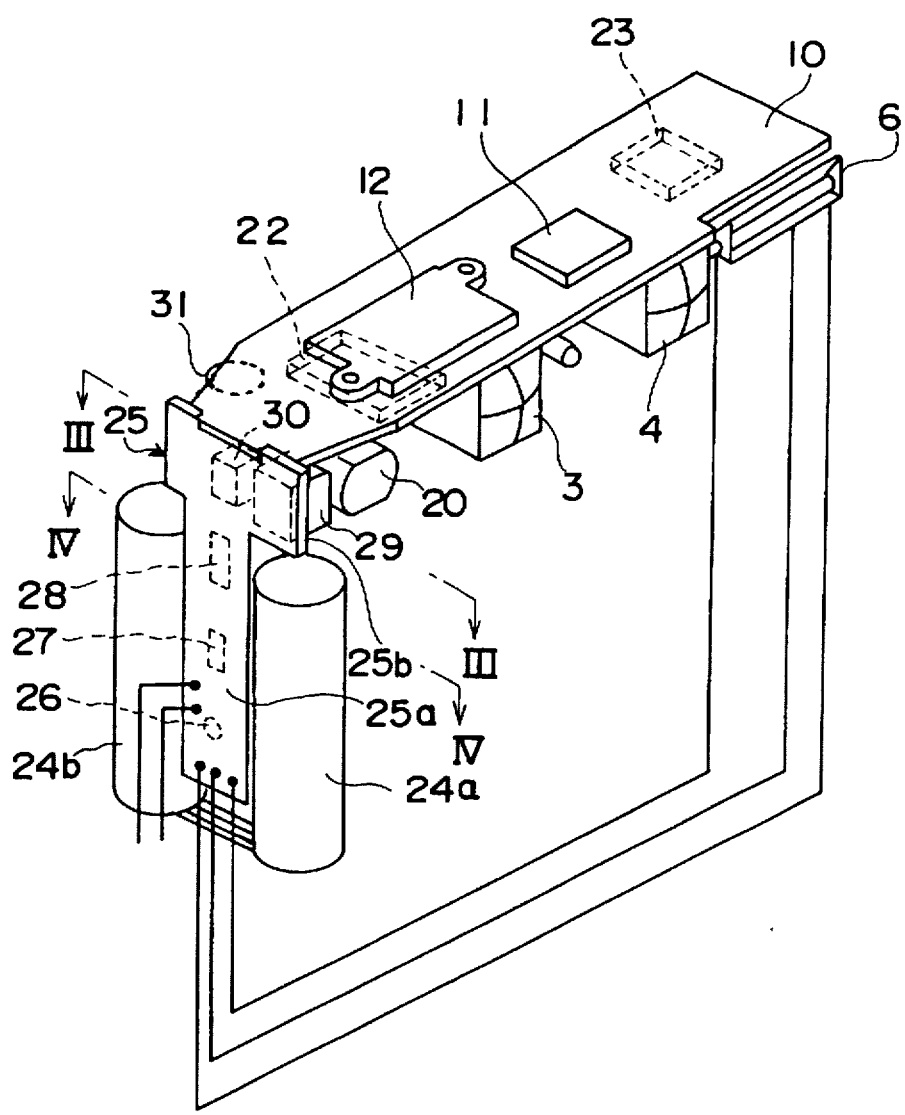
FIG. 2 is a perspective view of the camera of FIG. 1, showing the principal construction thereof.

In FIG. 1 and FIG. 2, the camera includes a camera body 1 and photographing lens barrel 2 arranged in the central portion of the front surface of the camera body 1. Inside the camera body 1, a light emission block 3 and a light receiving block 4, both collectively constituting a part of an active automatic focusing device, as well as an automatic exposure device (not shown) and the like, are arranged in the upper part therein. A finder optical system 5 is arranged between the light emission block 3 and the light receiving block 4. A flashing unit 6 of an electronic flashing device is disposed to the right of the light receiving block 4 as shown in FIG. 1.

Figure 3:
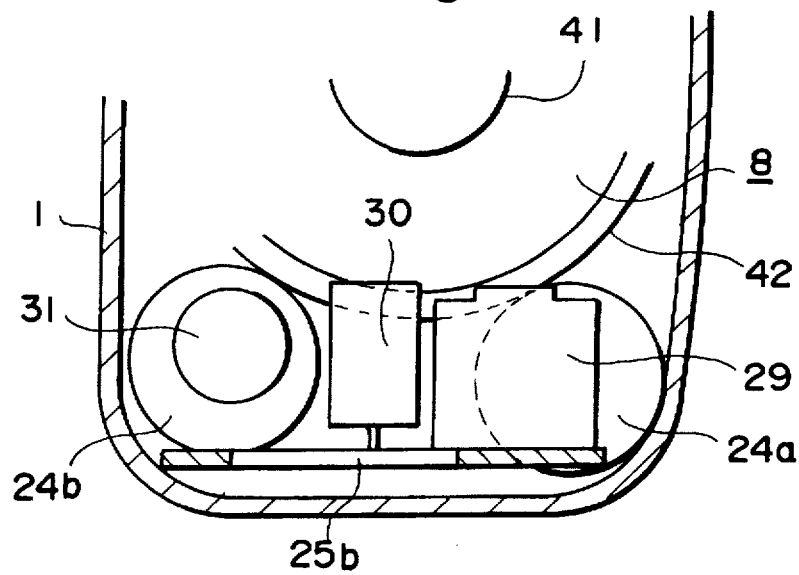
FIG. 3 is a cross-sectional view as seen from the line III—III in the direction of arrows in FIG. 2.
Figure 4:
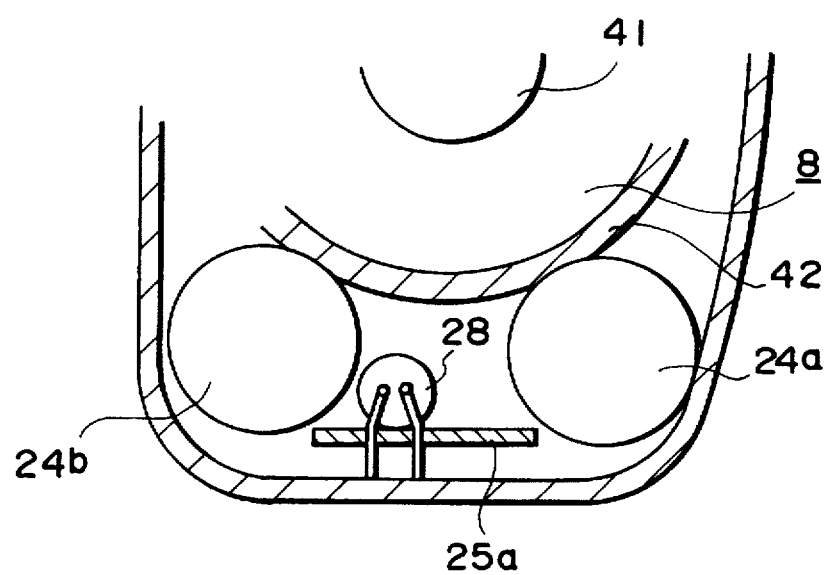
FIG. 4 is a cross-sectional view as seen from the line IV—IV in the direction of arrows in FIG. 2.

A film cartridge chamber 7 is located on the right end of the camera body 1, and a spool chamber 8 is located on the left end of the camera body 1, both as shown in FIG. 1. The film cartridge chamber 7 is adapted to be loaded with a film cartridge (not shown) therein. In the spool chamber 8, a film take-up spool 41 is rotatably seated to wind the film pulled out of the film cartridge. As shown in FIGS. 3 and 4, the spool chamber 8 is constituted by a framework 42 that has a curvature in compliance with the configuration of the spool 41. A power source battery 9 is loaded in the lower part of the camera body 1 between the film cartridge chamber 7 and the spool chamber 8.

A mount board 10 (rigid board) i.e., photographing control circuit board extends in the direction of the camera width parallel to the ceiling of the camera body 1. On the mount board 10, there are mounted a CPU 11 performing control of various parts in the camera, and a liquid crystal display (LCD) 12 indicating information such as the operation status for various parts in the camera, set mode and the number of exposed film frames. A shutter release button 13 protrudes from the upper surface of the camera body 1. A land portion for a release switch interlocked to the operation of the release button 13 is formed on the upper face of the mount board 10.

Although not shown, a circuit pattern is also formed on the mount board 10 for connecting the CPU 11, the LCD 12, the land portion for the release switch described above, and other electric parts.

In addition to the light emission block 3, the light receiving block 4, and the finder optical system 5 described above, a lens-barrel driving motor 20 is arranged under the mount board 10. Furthermore, a motor drive IC 22, an automatic focusing IC 23, and electric parts for control 31 (FIG. 2) are mounted on the lower surface of the mount board 10. A film winding motor is located within the film take-up spool 41. By the revolution of the motor, winding and rewinding of the film are conducted via a gear train GT.

Numerals 24a and 24b designate a pair of main capacitors storing charge for flash-activating. As shown in FIGS. 3 and 4, the pair of main capacitors 24a and 24b are disposed between the external circumferential surface of the framework 42 described above and the internal circumferential surface at one end of the camera body 1. The pair of main capacitors 4a and 24b are spaced in parallel with each other by a predetermined distance in the direction of the thickness of the camera so as to extend in the direction of the height of the camera (i.e., extend in the direction perpendicular to the film winding direction). One of the pair of main capacitors 24a is disposed on the front side of a portion of the framework 42 protruding outermost toward the one end of the camera body, and the other of the pair of main capacitors 24b is disposed on the rear side of the portion of the framework protruding outermost described above. Both main capacitors 24a and 24b abut the external circumferential surface of the framework 42. By arranging the capacitors 24a and 24b in such a manner, the lateral dimension (i.e. width) of the camera can be minimized.

A flash-activating circuit board 25 is located adjacent to the pair of main capacitor 24a and 24b and extends in the direction of the height of the camera. The circuit board 25 is integrally formed by a first part 25a arranged between the capacitors 24a and 24b, and a second part 25b located above the capacitors 24a and 24b and having a greater width than the first part 25a. The upper end of the second part 25b is engaged with the left end of the mount board 10 described above. On the capacitor side of the first part 25a, there are mounted small-sized electric parts, such as a transistor 26, a diode 27, and a neon tube 28 which is an element used to stop charging the capacitors 25a and 25b. Large-sized electric parts, such as a voltage step-up transformer 29 and a trigger capacitor 30 are mounted on the second part 25b. The flash-activating circuit is comprised of the small-sized electric parts and the large-sized electric parts. Thus, the small-sized electric parts described above are arranged between the pair of capacitors 24a and 24b, and the large-sized electric parts are arranged above the capacitors 24a and 24b, specifically, within a space between the upper surface of the capacitors 24a, 24b, and the mount board 10.

The circuit board 25 has a circuit pattern formed thereon that connects each electric part described above and the capacitors 24a, 24b. A specified portion of the pattern is also connected to the flashing unit 6 forming a flash-activating circuit. Furthermore, the circuit pattern on the circuit board 25 is appropriately connected to the circuit pattern of the mount board 10 described above. When the release button 13 is pressed down halfway, charging of the capacitors 24a, 24b is initiated. When the shutter is released, the charge in the capacitors 24a, 24b causes the flashing unit 6 to flash.

As described above, in the present embodiment according to the present invention, two capacitors 24a, 24b each having a small capacity, are employed for storing electric energy required for flash. The capacitors 24a, 24b are arranged along the internal circumferential surface at one end of the camera body. Thus, the diameter of each capacitor 24a, 24b diameter can be reduced. Whereby the lateral dimension, (i.e. width), of the camera can be shortened. In addition, since the electric parts constituting the flash-activating circuit are arranged in the space between the pair of capacitors 24a, 24b and the space above the capacitors 24a, 24b, the space within the camera body 1 can be used efficiently.

Further, in the above description, although the electric part is disposed in the space above the main capacitors 24a, the electric part may be disposed in the space below the main capacitors 24a or 24b.

Figure 5:
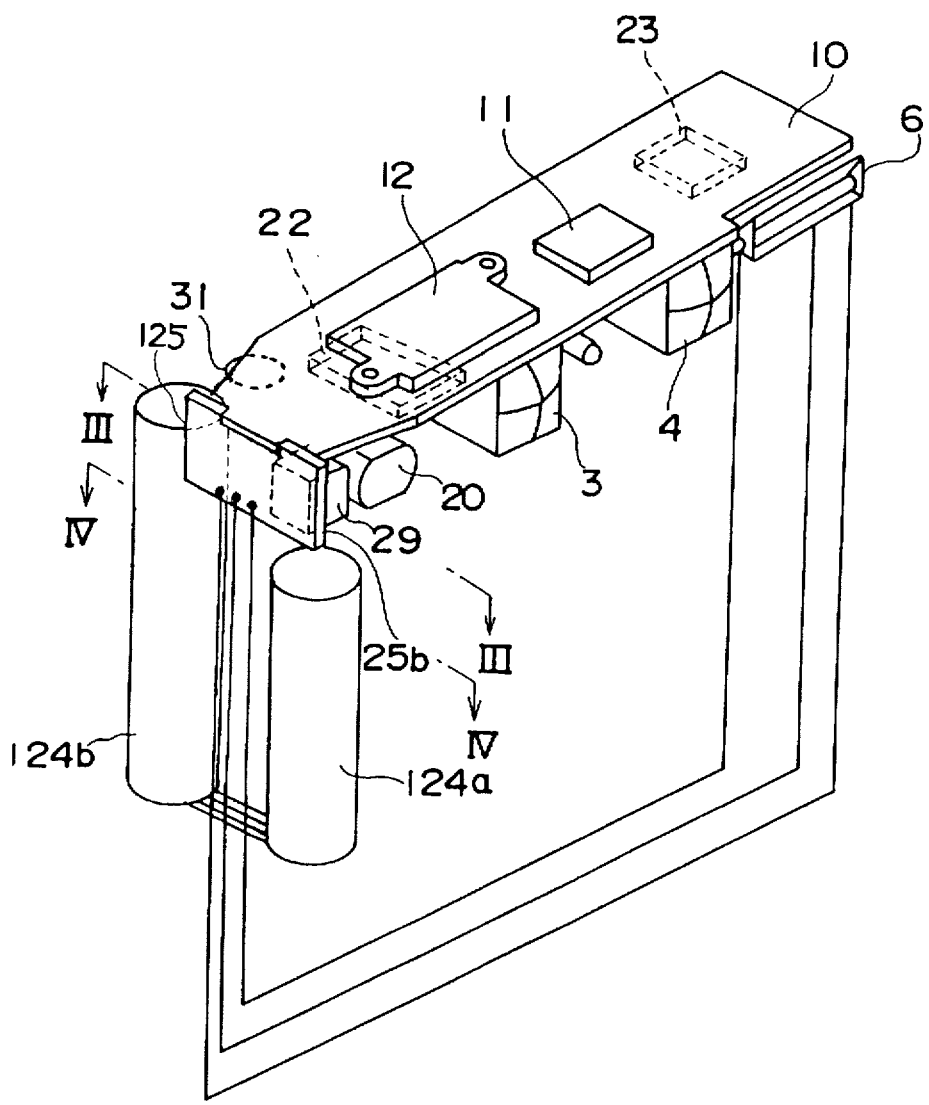
FIG. 5 is a perspective view of a camera according to another embodiment of the present invention.

FIG. 5 shows another embodiment of the present invention.

Two main capacitors 124a and 124b are provided for storing a charge for flash activating. Each of the main capacitors 124a and 124b has a different length and is arranged in parallel to each other in the direction of the thickness of the camera so as to extend in the direction of the height of the camera. A large-sized electric part, such as a voltage set-up transformer 29, is mounted on a flash-activating circuit board 125 so as to be located in the space above the short-length main capacitor 124a and on the side of the long-length main capacitor 124b.

In this embodiment, the space above the main capacitor 124a can be used efficiently for producing a compact-sized camera.

Figure 6:
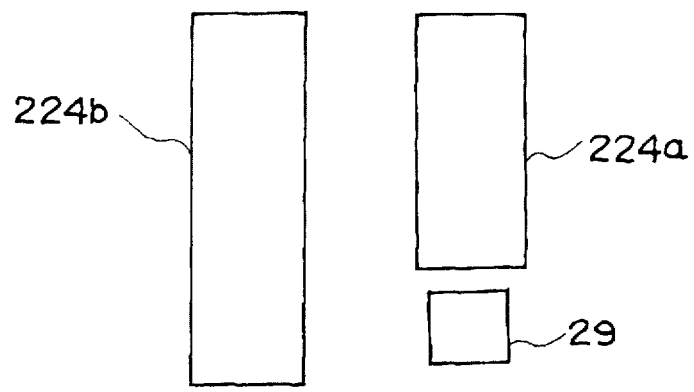
FIGS. 6 and 7 are principal side views of cameras according to the other embodiments as seen from the right side of the camera.
Figure 7:
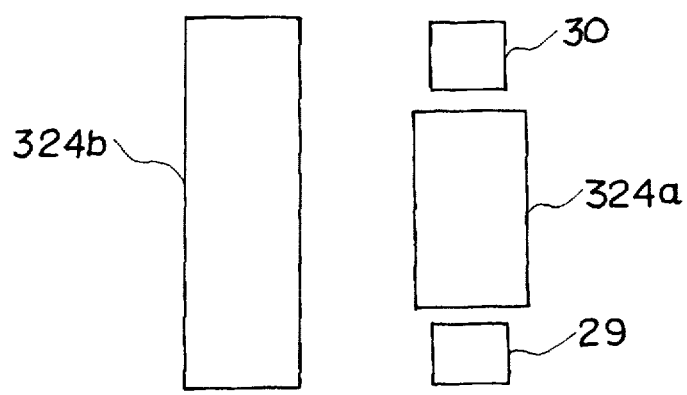

Further, electric parts 29 and 30 may be arranged as shown in FIG. 6 or 7 for example. In FIGS. 6 and 7, 224a, 224b 324a, 324b respectively denote two main capacitors each having different length.

While, in the above description, embodiments have been shown where the capacitors 24a, 24b and the mount board 25 are arranged at the left end portion of the camera body 1 as seen in FIGS. 1 and 2, these elements may be arranged at the right end portion or in the intermediate portion, depending on the arrangement of other elements. Also, the electric parts constituting the flash-activating circuit are not limited by the embodiments described above. It is acceptable for the capacitors 24a, 24b not to be arranged in parallel.

Further, in the above description, although a pair of flash-activating main capacitors 24a, 24b are used as a pair of electric energy storage devices, this storage devices may be a pair of power source batteries for example. In this case, a plurality of electric parts for a battery circuit may be used.

We claim:

1. A camera having a camera body with a thickness in one direction and a film winding direction perpendicular to said one direction, said camera comprising:

a pair of electric energy storage devices, each of said electric energy storage devices being spaced from each other in said one direction of the thickness so as to extend perpendicular to said film winding direction, the space between said electric energy storage devices being smaller than the diameter of each of said electric energy storage device;

a circuit board disposed between said pair of electric energy storage devices; and a plurality of electric parts mounted on said circuit board so as to be disposed within an imaginary tube having a length equal to and defined by a resultant length of said electric energy storage devices when the longitudinal axes of both of said electric energy storage devices are overlaid side by side on one another and a substantially elliptical cross-section defined by a smallest loop which circumscribes the diameters of both of said electric energy storage devices.

2. The camera according to claim 1, wherein each of said pair of electric energy storage devices is a flash-activating main capacitor, and said plurality of electric parts comprise flash-activating electric parts.

3. The camera according to claim 2, wherein said pair of electric energy storage devices are arranged in parallel along an internal circumferential surface at one end of said camera body.

4. The camera according to claim 1, further comprising:

a framework disposed within said camera body having an internal circumferential surface and an external circumferential surface, wherein said internal circumferential surface forms a chamber for accommodating a film take-up spool; and said pair of electric energy storage devices are arranged within said body so as to abut said external circumferential surface of said framework between said external circumferential surface of said framework and an internal circumferential surface at one end of said camera body.

5. The camera according to claim 4, wherein each of said pair of electric energy storage devices is a flash-activating main capacitor, and said plurality of electric parts comprise flash-activating electric parts.

6. The camera according to claim 5, wherein said framework is formed to have a curvature adapted to correspond to a configuration of said film take-up spool, one of said pair of electric energy storage devices is located between a front side of a portion of said framework and said one end of said camera body, and the other of said pair of electric energy storage devices is located between a rear side of said portion of said framework and said one end of said camera body.

7. The camera according to claim 1, wherein said circuit board includes a first part extending along a longitudinal direction of said pair of electric energy storage devices and a second part integrally formed with said first part and being located either above or below said pair of electric energy storage devices, at least one of a first electric part of said plurality of electric parts is mounted on said first part; and at least one of a second electric part of said plurality of electric parts which is larger than said first electric part is mounted on said second part.

8. The camera according to claim 7, further comprising:

a photographing control circuit board located within said camera body extending from said one end in a direction perpendicular to said circuit board, wherein said at least one second electric part mounted on said second part of said circuit board is located between said photographing control circuit board and said pair of electric energy storage devices.

9. A camera having a camera body with a thickness in one direction and a film winding direction perpendicular to said one direction, said camera comprising:

a pair of electric energy storage devices disposed along the internal circumferential surface at one end of the camera body, wherein each of said pair of electric energy storage devices has a diameter and is spaced from each other in said direction of the thickness of said camera so as to extend in a direction perpendicular to said film winding direction, the space between said pair of electric energy storage devices being smaller than said diameter;

a circuit board having a first part extending along a longitudinal direction of said pair of electric energy storage devices within an imaginary tube having a length equal to and defined by a resultant length of said electric energy storage devices when the longitudinal axes of both of said electric energy storage devices are overlaid side by side on one another and a substantially elliptical cross-section defined by a smallest loop which circumscribes the diameters of both of said electric energy storage devices and a second part integrally formed with said first part and being located above said pair of electric energy storage devices;

a photographing control circuit board located within said camera body extending from said one end of said camera body in a direction perpendicular to said circuit board;

at least one first electric part is mounted on said first part; and at least one second electric part which is larger than said first electric part is mounted on said second part of said circuit board and is located between said photographing control circuit board and upper end faces of said pair of electric energy storage devices.

10. The camera according to claim 9, wherein each of said pair of electric energy storage devices is a flash-activating main capacitor, and said first electric parts and said second electric parts include flash-activating electric parts.

11. A camera having a camera body with a thickness in one direction and a film winding direction perpendicular to said one direction, said camera comprising:

a pair of electric energy supplying devices, each of said pair of electric energy supplying devices having a diameter, said pair of electric energy supplying devices being spaced from each other in said one direction of the thickness so as to extend substantially perpendicular to said film winding direction, the space between said electric energy supplying devices being smaller than the diameter of each of said electric energy supplying devices;

a circuit board disposed within an imaginary tube having a length equal to and defined by a resultant length of said electric energy supplying devices when the longitudinal axes of both of said electric energy supplying devices are overlaid side by side on one another and a substantially elliptical cross-section defined by a smallest loop which circumscribes the diameters of both of said electric energy supplying devices; and a plurality of electric parts mounted on said circuit board so as to be disposed within said circle.

* * * * *